US012245384B2

(12) United States Patent
Nakamura et al.

(10) Patent No.: US 12,245,384 B2
(45) Date of Patent: Mar. 4, 2025

(54) SIGNAL TRANSMISSION CIRCUIT AND ELECTRONIC CONTROL DEVICE

(71) Applicant: HITACHI ASTEMO, LTD., Hitachinaka (JP)

(72) Inventors: Yuki Nakamura, Tokyo (JP); Masahiro Toyama, Tokyo (JP); Isao Hoda, Tokyo (JP); Hiroki Funato, Tokyo (JP); Umberto Paoletti, Tokyo (JP); Hideyuki Sakamoto, Hitachinaka (JP); Yutaka Uematsu, Tokyo (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 279 days.

(21) Appl. No.: 17/622,174

(22) PCT Filed: May 13, 2020

(86) PCT No.: PCT/JP2020/019163
§ 371 (c)(1),
(2) Date: Dec. 22, 2021

(87) PCT Pub. No.: WO2020/261790
PCT Pub. Date: Dec. 30, 2020

(65) Prior Publication Data
US 2022/0354006 A1    Nov. 3, 2022

(30) Foreign Application Priority Data

Jun. 24, 2019   (JP) ................................. 2019-116261

(51) Int. Cl.
*H05K 1/18*     (2006.01)
*H05K 5/00*     (2006.01)
*H05K 9/00*     (2006.01)

(52) U.S. Cl.
CPC ........... *H05K 5/0026* (2013.01); *H05K 1/181* (2013.01); *H05K 9/0015* (2013.01); *H05K 2201/10189* (2013.01)

(58) Field of Classification Search
CPC .................................................... H05K 5/0026
(Continued)

(56) References Cited

U.S. PATENT DOCUMENTS 7,384,306 B2 *   6/2008   Malstrom .......... H01R 13/6592
                                                                439/879
2004/0216910 A1  11/2004  Reis et al.
(Continued)

FOREIGN PATENT DOCUMENTS

JP          2006-509374 A       3/2006
JP          2014049877    *     8/2012
(Continued)

OTHER PUBLICATIONS

International Search Report with English translation and Written Opinion issued in corresponding application No. PCT/JP2020/019163 dated Aug. 25, 2020.

*Primary Examiner* — Stanley Tso
(74) *Attorney, Agent, or Firm* — Foley & Lardner LLP (57) ABSTRACT

A signal transmission circuit includes: a circuit board stored in a housing; a connector which is mounted on the circuit board and includes a first signal terminal and a first ground terminal; and an integrated circuit which is mounted on the circuit board and includes a second signal terminal and a second ground terminal. The first signal terminal and the second signal terminal are connected to each other by a signal wiring arranged on the circuit board. The first around terminal and the second ground terminal are connected to each other by a ground wiring arranged in a predetermined range including a portion immediately above or immediately below the signal wiring in the circuit board. At least a part (Continued)

of the ground wiring immediately above or immediately below the signal wiring has a high impedance structure formed to be wider than the signal wiring and narrower than a combined width of the first signal terminal and the first ground terminal.

9 Claims, 8 Drawing Sheets

(58) Field of Classification Search
USPC .......................................................... 361/752
See application file for complete search history.

(56) References Cited

U.S. PATENT DOCUMENTS

2010/0128449 A1* 5/2010 Mangaroo ............. G06F 1/1656
361/752

| | | | | |
|---|---|---|---|---|
| 2012/0212251 | A1* | 8/2012 | Yanagishima | ....... H03K 17/691 |
| | | | | 324/762.01 |
| 2012/0215287 | A1* | 8/2012 | Murtonen | .......... A61N 1/36125 |
| | | | | 607/2 |
| 2018/0024620 | A1 | 1/2018 | Gardner | |
| 2021/0185795 | A1 | 6/2021 | Toyama et al. | |

FOREIGN PATENT DOCUMENTS

| | | | | |
|---|---|---|---|---|
| JP | 2014-049877 | A | | 3/2014 |
| JP | 2015-153920 | A | | 8/2015 |
| JP | 3199753 | U | | 9/2015 |
| JP | 201029322 | | * | 9/2016 |
| JP | 2018-019398 | A | | 2/2018 |
| JP | 2018-029322 | A | | 2/2018 |
| WO | WO-2010103901 | A1 | * | 9/2010 ............... H05K 1/02 |
| WO | WO-2019/111655 | A1 | | 6/2019 |

* cited by examiner

SIGNAL TRANSMISSION CIRCUIT AND ELECTRONIC CONTROL DEVICE

TECHNICAL FIELD

The present invention relates to a signal transmission circuit and an electronic control device.

BACKGROUND ART

As a background art of the present invention, for example, the following PTL 1 is known. PTL 1 discloses a technique for attenuating AC common mode noise by a common mode choke coil in a communication system that conducts differential data via a pair of wires.

CITATION LIST

Patent Literature

PTL 1: JP 2018-19398 A

SUMMARY OF INVENTION

Technical Problem

The technique of PTL 1 can be applied to a communication system of a differential transmission scheme, but is not applicable to a communication system of another communication scheme.

Solution to Problem

A signal transmission circuit according to the present invention includes: a circuit board stored in a housing; a connector which is mounted on the circuit board and includes a first signal terminal and a first ground terminal; and an integrated circuit which is mounted on the circuit board and includes a second signal terminal and a second ground terminal. The first signal terminal and the second signal terminal are connected to each other by a signal wiring arranged on the circuit board. The first ground terminal and the second ground terminal are connected to each other by a ground wiring arranged in a predetermined range including a portion immediately above or immediately below the signal wiring in the circuit board. At least a part of the ground wiring immediately above or immediately below the signal wiring has a high impedance structure formed to be wider than the signal wiring and narrower than a combined width of the first signal terminal and the first around terminal.

An electronic control device according to the present invention includes the above-described signal transmission circuit.

Advantageous Effects of Invention

According to the present invention, common mode noise can be reduced in a communication scheme other than differential transmission.

DESCRIPTION OF EMBODIMENTS

Hereinafter, embodiments of the present invention will be described with reference to the drawings. The following description and drawings are examples given to describe the invention, and are appropriately omitted and simplified for clarification of the description. The present invention can be implemented in various other forms. Each component may be singular or plural unless specifically limited.

Positions, sizes, shapes, ranges, and the like of the respective components illustrated in the drawings do not always indicate actual positions, sizes, shapes, ranges and the like in order to facilitate understanding of the invention. Therefore, the present invention is not necessarily limited to the positions, sizes, shapes, ranges, and the like disclosed in the drawings.

When there are a plurality of components having the same or similar functions, the same reference sign will be sometimes described with different subscripts. When it is unnecessary to distinguish between the plurality of components, however, the subscripts will be sometimes omitted in the description.

Hereinafter, the embodiments of the present invention will be described with reference to the drawings.

First Embodiment

Hereinafter, a first embodiment of the present invention will be described with reference to FIG. 1.

Figure 1:
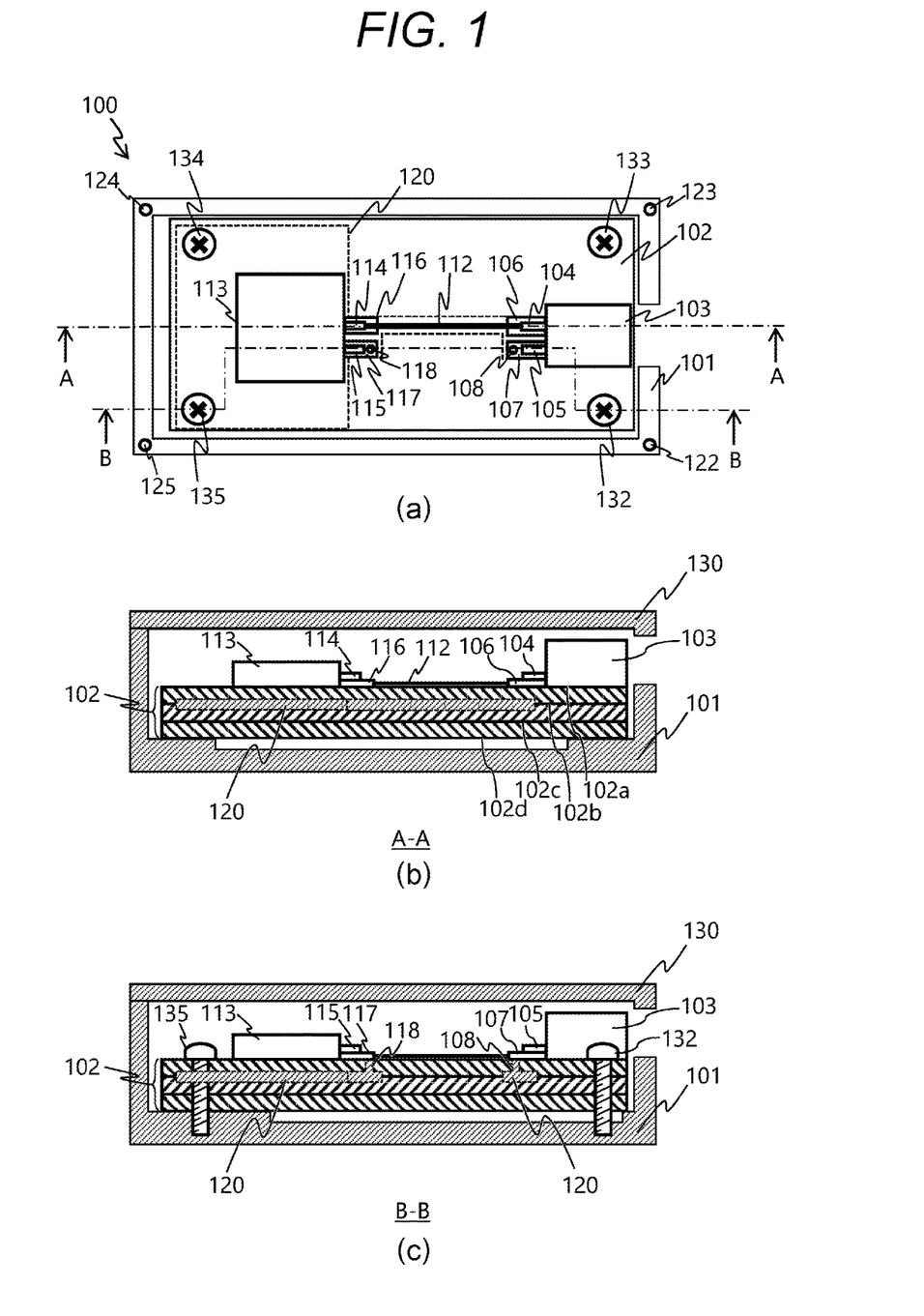
FIG. 1 is a view illustrating a signal transmission circuit according to a first embodiment of the present invention.

FIG. 1 is a view illustrating a signal transmission circuit 100 according to the first embodiment of the present invention. In FIG. 1, (a) illustrates a top view of the signal transmission circuit 100 of the present embodiment, (b) illustrates a cross-sectional view taken along line A-A of the signal transmission circuit 100 of the present embodiment, and (c) illustrates a cross-sectional view taken along line B-B of the signal transmission circuit 100 of the present embodiment.

As illustrated in FIG. 1, a circuit board 102 is built in a housing, constituted by a metal cover 130 and a metal base 101, in the signal transmission circuit 100 of the present embodiment. Each of the metal cover 130 and the metal base 101 is formed using metal such as iron which is a conductor. FIG. 1(a) illustrates a state where the metal cover 130 has been removed in order to clearly illustrate a configuration of the circuit board 102. Note that FIG. 1 illustrates an example in which the housing that accommodates the circuit board 102 is constituted by the metal cover 130 and the metal base 101, but the housing may be formed using a conductor other than metal.

The metal base 101 is provided with screw holes 122 to 125. The metal cover 130 is fixed to the metal base 101 with screws at positions respectively corresponding to these screw holes, thereby forming the housing that accommodates the circuit board 102. The circuit board 102 is fixed to the metal base 101 by metal screws 132 to 135.

On the circuit board 102, a coaxial connector 103 electrically connecting a coaxial cable (not illustrated) and the circuit board 102, and an integrated circuit 113 for signal transmission and reception are mounted. The coaxial connector 103 includes a connector signal terminal 104 and a connector ground terminal 105. The connector signal terminal 104 and the connector ground terminal 105 are soldered and connected to component mounting pads 106 and 107, respectively, provided on the circuit board 102. The integrated circuit 113 includes an integrated circuit signal terminal 114 and an integrated circuit ground terminal 115. The integrated circuit signal terminal 114 and the integrated circuit ground terminal 115 are soldered and connected to component mounting pads 116 and 117, respectively, provided on the circuit board 102.

The circuit board 102 has a multilayer structure in which a first layer 102a, a second layer 102b, a third layer 102c, and a fourth layer 102d are laminated. Note that the number of layers of the circuit board 102 is not limited thereto. A signal wiring 112 connecting the component mounting pads 106 and 116 is arranged on the first layer 102a of the circuit board 102. As the connector signal terminal 104 and the integrated circuit signal terminal 114 are connected to each other via the signal wiring 112, a signal can be input and output between the coaxial connector 103 and the integrated circuit 113.

A signal ground wiring 120 is arranged on the second layer 102b of the circuit board 102. The component mounting pads 107 and 117 to which the connector ground terminal 105 and the integrated circuit ground terminal 115 are connected are connected to the signal ground wiring 120 respectively via ground vias 108 and 118 penetrating the first layer 102a and the second layer 102b. The signal ground wiring 120 is electrically connected to the metal base 101 via the metal screws 134 and 135 arranged closer to the integrated circuit 113 among the metal screws 132 to 135 for fixing the circuit board 102 to the metal base 101. As a result, the connector ground terminal 105 and the integrated circuit ground terminal 115 are connected to each other by the signal ground wiring 120, and are electrically connected to the metal base 101 via the signal ground wiring 120.

Power is supplied to the integrated circuit 113 by a Power over Coax (PoC) scheme via the coaxial cable connected to the coaxial connector 103. That is, the coaxial cable connected to the coaxial connector 103 transmits power, supplied from the outside, to be superimposed on a signal input or output via the signal wiring 112 between the connector signal terminal 104 and the integrated circuit signal terminal 114. The integrated circuit 113 operates using the power supplied from the coaxial cable via the coaxial connector 103, and transmits and receives a signal to and from an external device connected via the coaxial cable.

The signal ground wiring 120 is arranged in a predetermined range including a portion immediately below the signal wiring 112 in the circuit board 102. As illustrated in FIG. 1(a), the signal ground wiring 120 is formed immediately below the signal wiring 112 to be wider than the signal wiring 112 and to be narrower than a combined width of the connector signal terminal 104 and the connector ground terminal 105. Since a part of the signal ground wiring 120 has such a structure, the signal transmission circuit 100 of the present embodiment reduces common mode noise entering the integrated circuit 113 from the coaxial cable such that the impedance with respect to the noise becomes relatively high as compared with other parts. Hereinafter, such a structure of the signal ground wiring 120 is referred to as a "high impedance structure".

Hereinafter, a reduction mechanism of the common mode noise using the high impedance structure will be described. In general, the coaxial cable has a multilayer structure in which a central conductor, a dielectric, a metal shield, and an insulating outer sheath are laminated in order from the center. When external electromagnetic noise propagates through the space and reaches the coaxial cable, the noise is coupled with the metal shield of the coaxial cable and propagates along the coaxial cable. When the coaxial cable is connected to the coaxial connector 103, the metal shield is connected to the connector ground terminal 105, and thus, the noise propagating through the coaxial cable enters the signal ground wiring 120 via the connector ground terminal 105 as the common mode noise.

Therefore, the width of the portion of the signal ground wiring 120 immediately below the signal wiring 112 is set to be narrow as described above in the signal transmission circuit 100 of the present embodiment. This narrow portion serves as the high impedance structure having a high impedance with respect to the noise entering from the connector ground terminal 105 as compared with other portions. Therefore, the amount of noise propagating from the connector ground terminal 105 toward the integrated circuit 113 via the signal ground wiring 120 can be reduced.

Here, if the signal around wiring 120 is secured immediately below the signal wiring 112, the inductance does not increase to such an extent as to affect a signal with respect to the signal input and output between the connector signal terminal 104 and the integrated circuit signal terminal 114 via the signal wiring 112. On the other hand, an increase in inductance can be expected by the narrowed width of the signal ground wiring 120 with respect to the common mode noise from the outside. Therefore, it is possible to suppress the entry of common mode noise into the integrated circuit 113 without degrading the signal quality by forming the above-described narrow high impedance structure immediately below the signal wiring 112 in the signal ground wiring 120. Note that a portion of the signal ground wiring 120 formed in the above-described narrow shape is preferably about five times as wide as the signal ground wiring 120, for example. In this manner, it is possible to realize the high impedance structure in which the impedance with respect to noise is sufficiently high while securing the signal quality.

According to the first embodiment of the present invention described above, the following operational effects are achieved.

(1) The signal transmission circuit 100 includes: the circuit board 102 stored in the housing constituted by the metal cover 130 and the metal base 101; the coaxial connector 103 which is mounted on the circuit board 102 and includes the connector signal terminal 104 and the connector ground terminal 105; and the integrated circuit 113 which is mounted on the circuit board 102 and includes the integrated circuit signal terminal 114 and the integrated circuit ground terminal 115. The connector signal terminal 104 and the integrated circuit signal terminal 114 are connected to each other by the signal wiring 112 arranged on the circuit board 102. The connector ground terminal 105 and the integrated circuit ground terminal 115 are connected to each other by the signal ground wiring 120 arranged in the predetermined range including the portion immediately below the signal wiring 112 in the circuit board 102. At least a part of the signal ground wiring 120 immediately below the signal wiring 112 has the high impedance structure formed to be wider than the signal wiring 112 and narrower than the combined width of the connector signal terminal 104 and the connector ground terminal 105. Thus, the common mode noise can be reduced in a communication scheme other than differential transmission.

(2) The coaxial connector 103 is the coaxial connector that electrically connects the coaxial cable and the circuit board 102. Thus, it is possible to reduce the common mode noise when communication is performed using the coaxial cable.

(3) The coaxial cable transmits power to be superimposed on a signal input and output between the connector signal terminal 104 and the integrated circuit signal terminal 114, and the integrated circuit 113 operates using the power supplied from the coaxial cable via the coaxial connector 103. Thus, the common mode noise can be reduced in the PoC scheme.

Second Embodiment

Hereinafter, a second embodiment of the present invention will be described with reference to FIG. 2.

Figure 2:
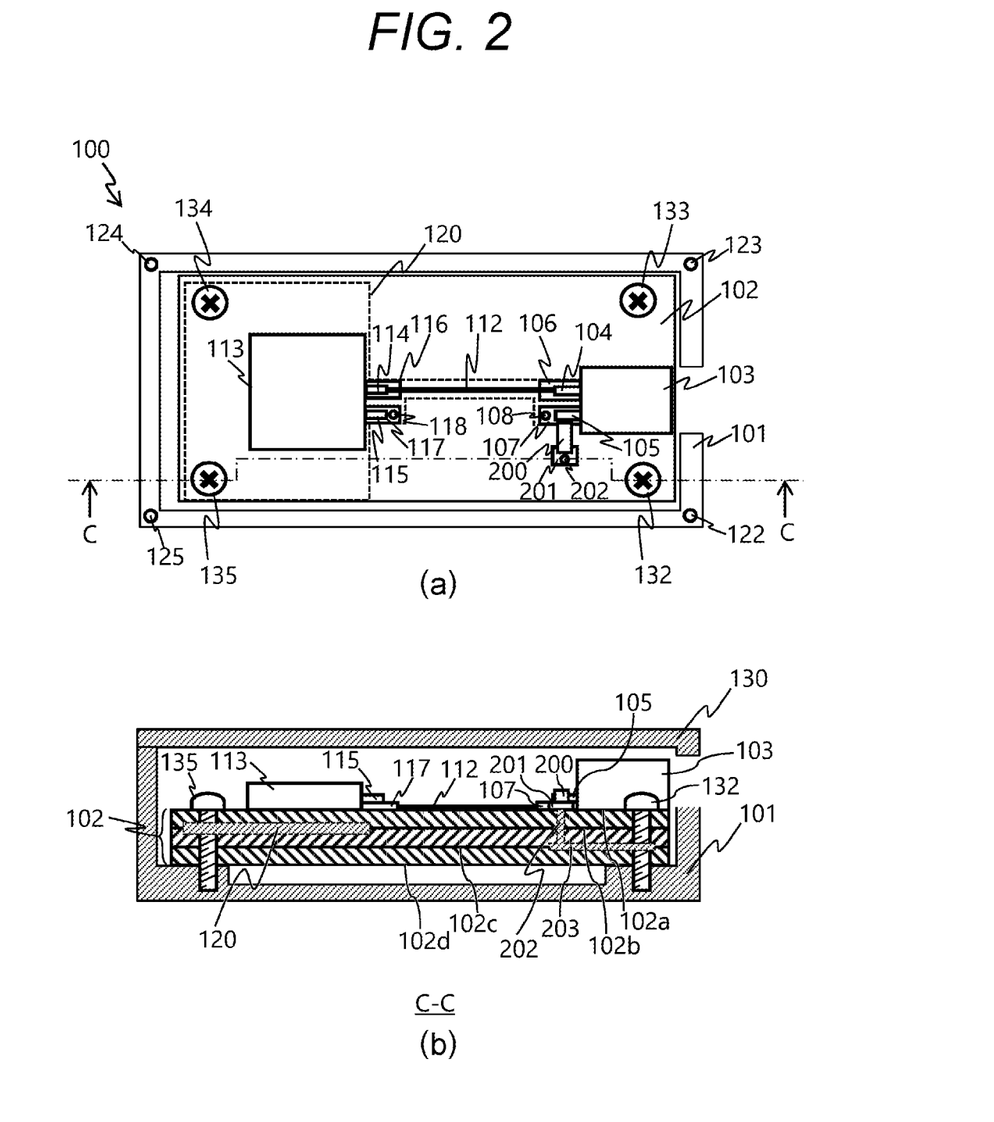
FIG. 2 is a view illustrating a signal transmission circuit according to a second embodiment of the present invention.

FIG. 2 is a view illustrating the signal transmission circuit 100 according to the second embodiment of the present invention. In FIG. 2, (a) illustrates a top view of the signal transmission circuit 100 of the present embodiment, and (b) illustrates a cross-sectional view taken along line C-C of the signal transmission circuit 100 of the present embodiment.

The signal transmission circuit 100 of the present embodiment is different from that of the first embodiment in that a structure in which the connector ground terminal 105 is electrically connected to the metal base 101 via a capacitive element 200 is added. Specifically, a component mounting pad 201 is additionally provided on the circuit board 102 in the signal transmission circuit 100 of the present embodiment, as illustrated in FIG. 2. The capacitive element 200 is connected between the component mounting pad 201 and the component mounting pad 107 to which the connector ground terminal 105 is connected. The component mounting pad 201 is connected to a frame ground wiring 203 wired on the third layer 102c of the circuit board 102 via a ground via 202 penetrating the first layer 102a, the second layer 102b, and the third layer 102c of the circuit board 102. The frame ground wiring 203 is in contact with the metal screw 132 that fixes the circuit board 102 to the metal base 101. With such a structure, the connector ground terminal 105 is electrically connected to the metal base 101 via the capacitive element 200.

In the signal transmission circuit 100 of the present embodiment, noise having entered the circuit board 102 from the connector ground terminal 105 is dropped to the metal base 101 via the capacitive element 200, the ground via 202, the frame ground wiring 203, and the metal screw 132 immediately after the entry with the above-described structure. That is, a low impedance structure having a relatively lower impedance than the high impedance structure of the signal ground wiring 120 described in the first embodiment is provided on the connector ground terminal 105 side. As a result, the amount of noise propagating from the connector ground terminal 105 toward the integrated circuit 113 via the signal ground wiring 120 can be further reduced as compared with the signal transmission circuit 100 described in the first embodiment.

Note that it is desirable to make the impedance with respect to noise as low as possible by shortening a connection path from the connector ground terminal 105 to the metal base 101 as much as possible in order to further enhance a noise reduction effect using the low impedance structure of the present embodiment.

According to the second embodiment of the present invention described above, a housing that stores the circuit board 102 is formed using a conductor such as metal, and the connector ground terminal 105 is electrically connected to the housing via the capacitive element 200. Thus, the common mode noise can be further reduced.

Third Embodiment

Hereinafter, a third embodiment of the present invention will be described with reference to FIG. 3.

Figure 3:
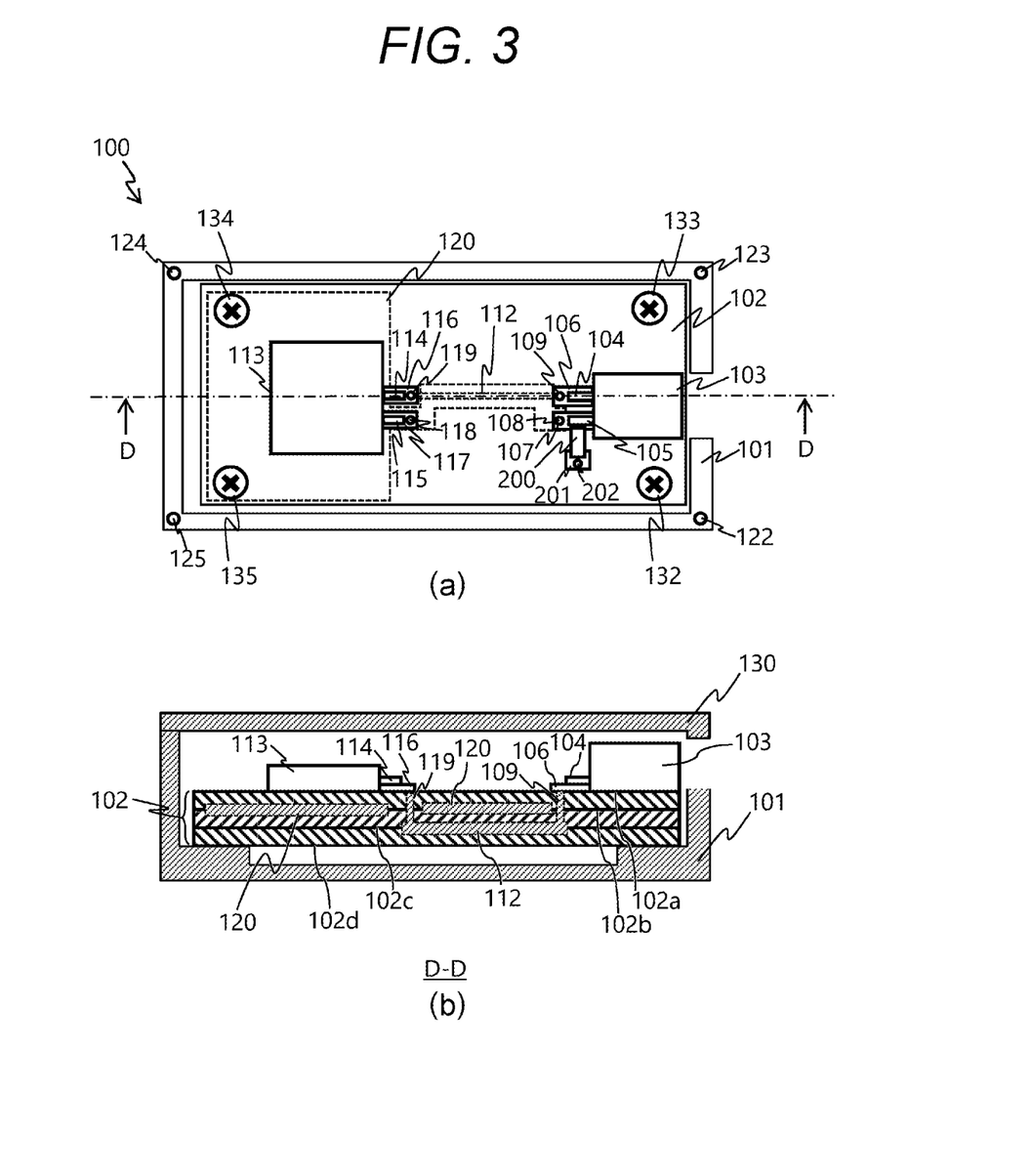
FIG. 3 is a view illustrating a signal transmission circuit according to a third embodiment of the present invention.

FIG. 3 is a view illustrating the signal transmission circuit 100 according to the third embodiment of the present invention. In FIG. 3, (a) illustrates a top view of the signal transmission circuit 100 of the present embodiment, and (b) illustrates a cross-sectional view taken along line D-D of the signal transmission circuit 100 of the present embodiment.

The signal transmission circuit 100 of the present embodiment is an example in which a positional relationship between the signal wiring 112 and the signal ground wiring 120 in the second embodiment is vertically reversed. Specifically, in the circuit board 102, the signal wiring 112 is arranged on the third layer 102c below the second layer 102b on which the signal ground wiring 120 is arranged. The component mounting pads 106 and 116 to which the connector signal terminal 104 and the integrated circuit signal terminal 114 are connected are connected to the signal wiring 112 respectively via ground vias 109 and 119 penetrating the first layer 102a, the second layer 102b, and the third layer 102c.

According to the third embodiment of the present invention described above, the signal transmission circuit 100 includes: the circuit board 102 stored in a housing; the coaxial connector 103 which is mounted on the circuit board 102 and includes the connector signal terminal 104 and the connector ground terminal 105; and the integrated circuit 113 which is mounted on the circuit board 102 and includes the integrated circuit signal terminal 114 and the integrated circuit ground terminal 115. The connector signal terminal 104 and the integrated circuit signal terminal 114 are connected to each other by the signal wiring 112 arranged on the circuit board 102. The connector ground terminal 105 and the integrated circuit ground terminal 115 are connected to each other by the signal ground wiring 120 arranged in a predetermined range including a portion immediately above the signal wiring 112 in the circuit board 102. At least a part of the signal ground wiring 120 immediately above the signal wiring 112 has a high impedance structure formed to be wider than the signal wiring 112 and narrower than a combined width of the connector signal terminal 104 and the connector ground terminal 105. Thus, the common mode noise can be reduced in a communication scheme other than differential transmission similarly to the first embodiment.

Fourth Embodiment

Hereinafter, a fourth embodiment of the present invention will be described with reference to FIG. 4.

Figure 4:
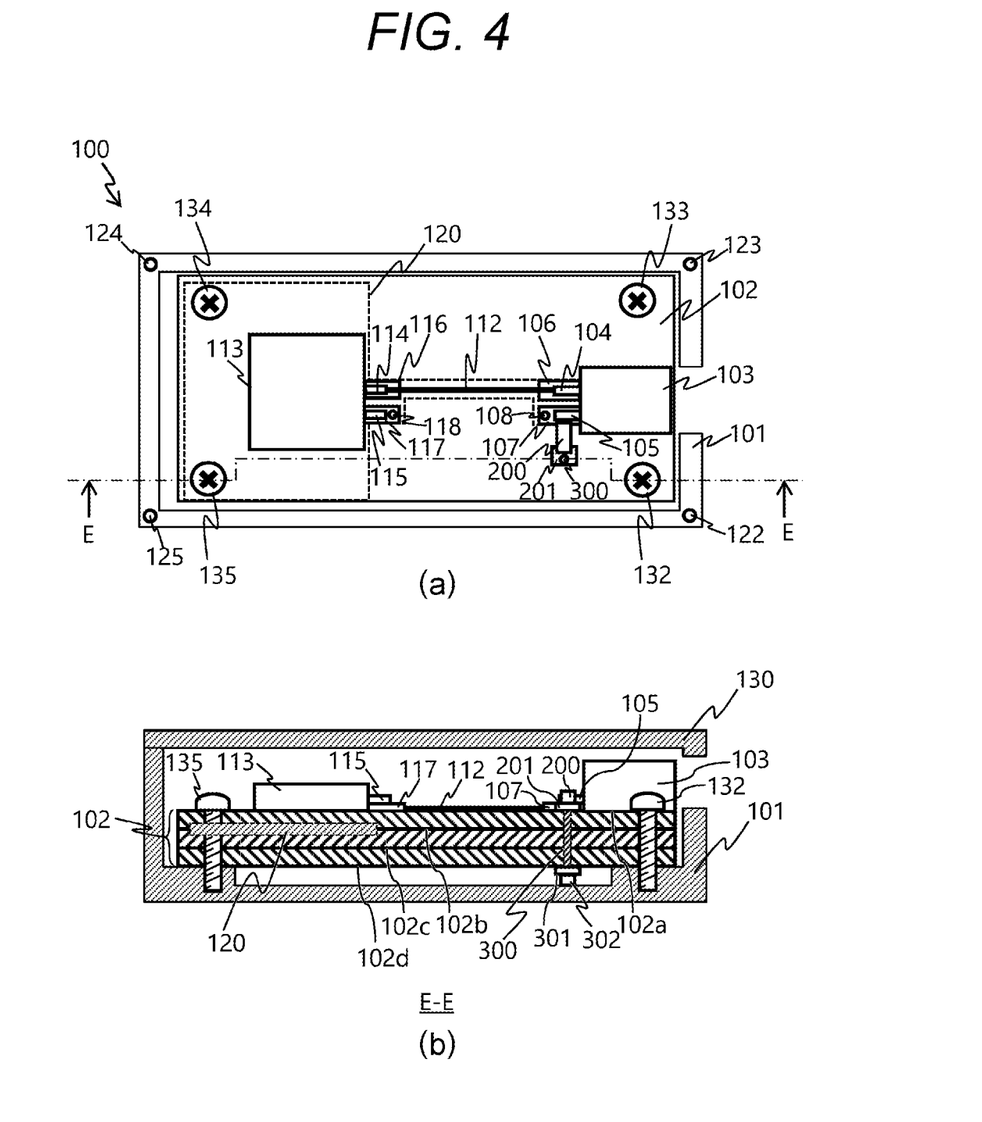
FIG. 4 is a view illustrating a signal transmission circuit according to a fourth embodiment of the present invention.

FIG. 4 is a view illustrating the signal transmission circuit 100 according to the fourth embodiment of the present invention. In FIG. 4, (a) illustrates a top view of the signal transmission circuit 100 of the present embodiment, and (b) illustrates a cross-sectional view taken along line E-E of the signal transmission circuit 100 of the present embodiment.

The signal transmission circuit 100 of the present embodiment realizes the connection with the metal base 101 in the low impedance structure described in the second embodiment using an EMI gasket 302. That is, in the low impedance structure of the second embodiment, the frame ground wiring 203 connecting the connector ground terminal 105 and the metal screw 132 is lengthened when a distance from the connector ground terminal 105 to the metal screw 132 is increased, and as a result, the impedance is increased, which is a problem. In the present embodiment, the EMI gasket 302 is adopted as a structure for solving this problem.

The EMI gasket 302 is a component formed by winding a conductive woven fabric around a sponge-like material such as urethane, for example, and is generally used to achieve electrical conduction between different conductors. In the signal transmission circuit 100 of the present embodiment, the EMI gasket 302 is arranged between the circuit board 102 and the metal base 101 in a state of being soldered and connected to a component mounting pad 301 provided on the fourth layer 102d of the circuit board 102. The component mounting pad 107 connected to the capacitive element 200 is connected to the component mounting pad 301 via a ground via 300 penetrating the first layer 102a, the second layer 102b, the third layer 102c, and the fourth layer 102d. With such a structure, the connector ground terminal 105 is electrically connected to the metal base 101 via the capacitive element 200 and the EMI gasket 302.

In the signal transmission circuit 100 of the present embodiment, the above-described structure allows a low impedance structure to be formed without depending on the distance between the connector ground terminal 105 and the metal screw 132.

According to the fourth embodiment of the present invention described above, the signal transmission circuit 100 includes the EMI gasket 302 arranged between the circuit board 102 and a housing. The connector ground terminal 105 is electrically connected to the housing via the capacitive element 200 and the EMI gasket 302. Thus, further reduction of the common mode noise with the low impedance structure can be reliably achieved.

Fifth Embodiment

Hereinafter, a fifth embodiment of the present invention will be described with reference to FIG. 5.

Figure 5:
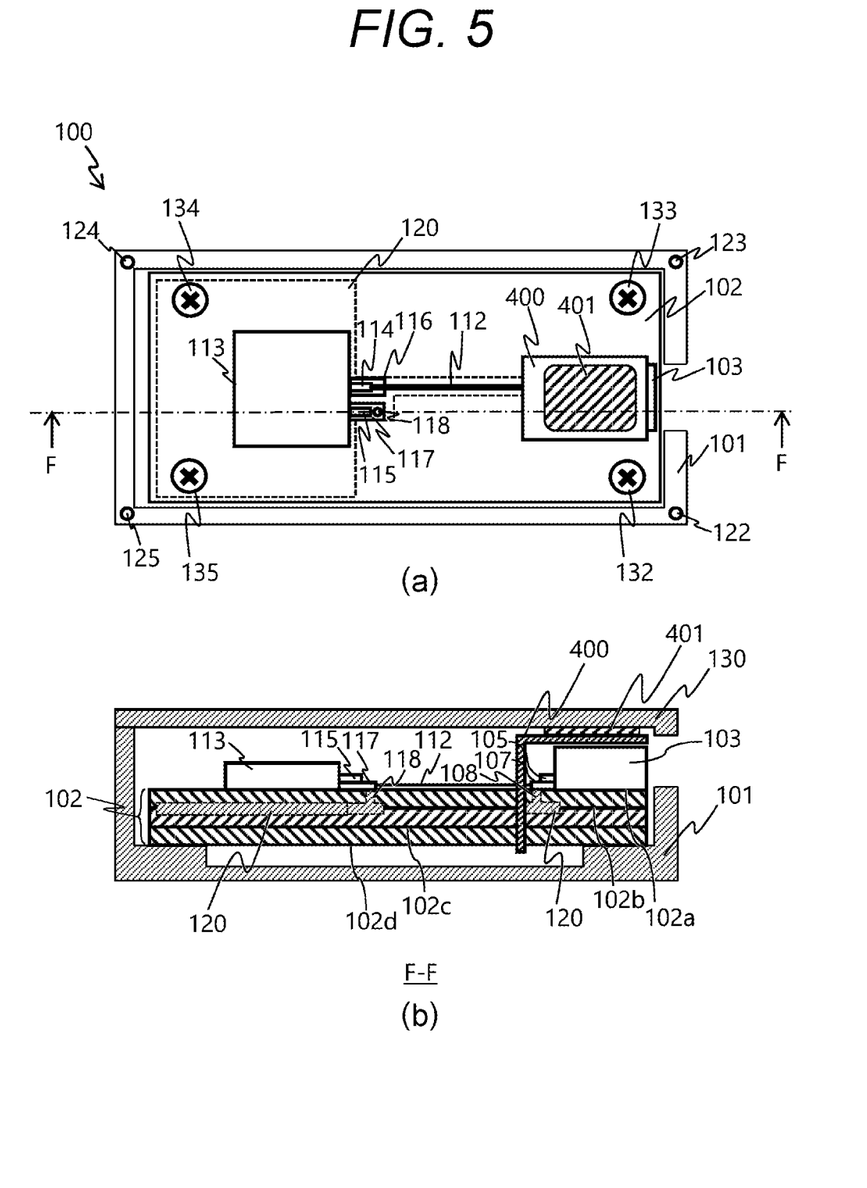
FIG. 5 is a view illustrating a signal transmission circuit according to a fifth embodiment of the present invention.

FIG. 5 is a view illustrating the signal transmission circuit 100 according to the fifth embodiment of the present invention. In FIG. 5, (a) illustrates a top view of the signal transmission circuit 100 of the present embodiment, and (b) illustrates a cross-sectional view taken along line F-F of the signal transmission circuit 100 of the present embodiment.

The signal transmission circuit 100 of the present embodiment realizes the low impedance structure described in the second embodiment using a conductive connector shield 400 and a dielectric 401. As illustrated in FIG. 5, the connector shield 400 is arranged so as to cover the periphery of the coaxial connector 103, and is formed using a conductive member such as metal. The connector shield 400 penetrates through the circuit board 102 and is in contact with the signal ground wiring 120 wired to the circuit board 102. The dielectric 401 is arranged between the connector shield 400 and the metal cover 130. Note that the dielectric 401 may be an adhesive for bonding the connector shield 400 and the metal cover 130, heat dissipation grease for promoting heat dissipation of each component such as the integrated circuit 113 mounted on the circuit board 102, or the like.

In the signal transmission circuit 100 of the present embodiment, the connector ground terminal 105 is electrically connected to the metal cover 130 via the connector shield 400 and the dielectric 401 with the above-described structure. Therefore, similarly to the second embodiment, a low impedance structure having a relatively low impedance can be provided on the connector ground terminal 105 side as compared with the high impedance structure of the signal ground wiring 120 described in the first embodiment. As a result, the amount of noise propagating from the connector ground terminal 105 toward the integrated circuit 113 via the signal ground wiring 120 can be further reduced as compared with the signal transmission circuit 100 described in the first embodiment.

According to the fifth embodiment of the present invention described above, the signal transmission circuit 100 includes the conductive connector shield 400 arranged around the coaxial connector 103, and the dielectric 401 arranged between the connector shield 400 and the metal cover 130. A housing that stores the circuit board 102 is formed using a conductor such as metal, and the connector ground terminal 105 is electrically connected to the housing via the connector shield 400 and the dielectric 401. Thus, the common mode noise can be further reduced.

Sixth Embodiment

Hereinafter, a sixth embodiment of the present invention will be described with reference to FIG. 6.

Figure 6:
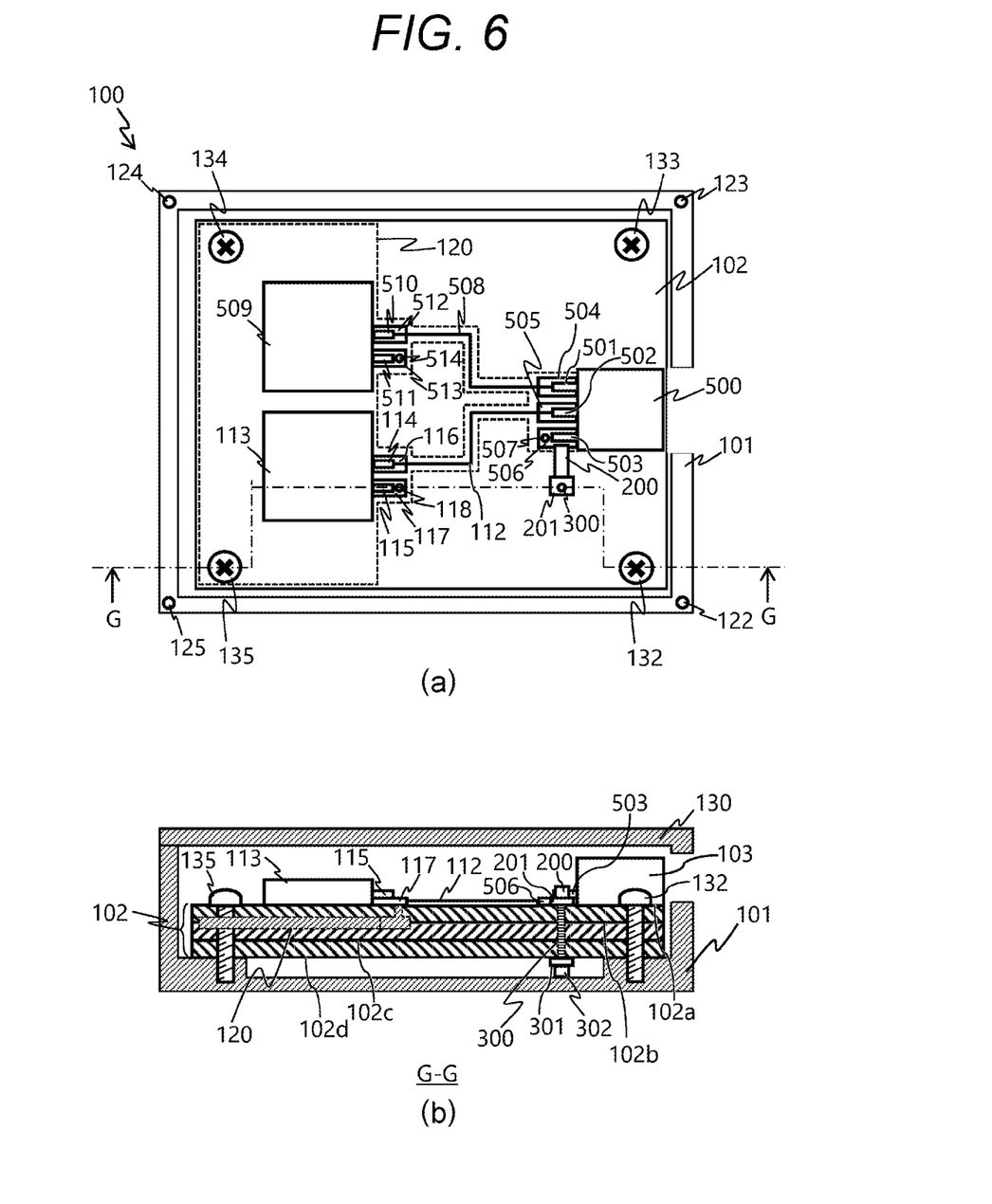
FIG. 6 is a view illustrating a signal transmission circuit according to a sixth embodiment of the present invention.

FIG. 6 is a view illustrating the signal transmission circuit 100 according to the sixth embodiment of the present invention. In FIG. 6, (a) illustrates a top view of the signal transmission circuit 100 of the present embodiment, and (b) illustrates a cross-sectional view taken along line G-G of the signal transmission circuit 100 of the present embodiment.

In the present embodiment, a description will be given regarding an example of a structure of the signal transmission circuit 100 in a case where a multi-pole coaxial connector is used instead of the single-pole coaxial connector 103. Note that the case where a two-pole coaxial connector 500 having two signal terminals is used as an example of the multi-pole coaxial connector has been described in the present embodiment, but a coaxial connector having three or more signal terminals may be used.

Note that the present embodiment adopts the low impedance structure using the EMI gasket 302 similarly to the fourth embodiment, but a description thereof will be omitted. Hereinafter, a high impedance structure of the present embodiment will be described.

The two-pole coaxial connector 500 and two integrated circuits 113 and 509 are mounted on the circuit board 102. The two-pole coaxial connector 500 includes two connector signal terminals 501 and 502 as many as the integrated circuits 113 and 509, and a connector ground terminal 503 common to these signal terminals. The connector signal terminals 501 and 502 and the connector ground terminal 503 are soldered and connected to component mounting pads 504, 505, and 506, respectively, provided on the circuit board 102. The integrated circuit 509 having a similar function as the integrated circuit 113 includes an integrated circuit signal terminal 510 and an integrated circuit ground terminal 511. The integrated circuit signal terminal 510 and the integrated circuit ground terminal 511 are soldered and connected to component mounting pads 512 and 513, respectively, provided on the circuit board 102.

On the first layer 102a of the circuit board 102, a signal wiring 508 that connects the component mounting pads 504 and 512 is further arranged in addition to the signal wiring 112 that connects the component mounting pads 505 and 116. The connector signal terminal 502 and the integrated circuit signal terminal 114 are connected to each other, and the connector signal terminal 501 and the integrated circuit signal terminal 510 are connected to each other via the signal wirings 112 and 508, respectively, so that signals can be input and output between the two-pole coaxial connector 500 and each of the integrated circuits 113 and 509.

The component mounting pad 506 to which the connector ground terminal 503 is connected is connected to the signal ground wiring 120 via a ground via 507 penetrating the first layer 102a and the second layer 102b. Similarly, the component mounting pads 117 and 513 to which the integrated circuit ground terminals 115 and 511 are connected are also connected to the signal ground wiring 120 respectively via ground vias 118 and 514 penetrating the first layer 102a and the second layer 102b. As a result, the connector ground terminal 503 and each of the integrated circuit ground terminals 115 and 511 are connected by the signal ground wiring 120.

The signal ground wiring 120 is arranged in a predetermined range including a portion immediately below each of the signal wirings 112 and 508 in the circuit board 102. As illustrated in FIG. 6(a), the signal ground wiring 120 is formed to be wider than the signal wirings 112 and 508 and to be narrower than a combined width of the connector signal terminal 501 or 502 and the connector around terminal 503 immediately below the signal wirings 112 and 508, respectively. As a result, the common mode noise entering the integrated circuits 113 and 509 from coaxial cables connected to the two-pole coaxial connector 500 is reduced by forming the high impedance structure using the signal ground wiring 120 for each of the signal wirings 112 and 508 even in the signal transmission circuit 100 of the present embodiment.

Note that the description has been given in the present embodiment regarding the structure example of the signal transmission circuit 100 in the case where the two integrated circuits 113 and 509 are mounted on the circuit board 102 and the two-pole coaxial connector 500 is used for these integrated circuits 113 and 509, but the number of integrated circuits and the number of poles of the coaxial connector are not limited thereto. Even when a coaxial connector having the same number of poles as the number of integrated circuits mounted on the circuit board 102 is used, the structure similar to that of the present embodiment can be adopted.

According to the sixth embodiment of the present invention described above, the signal transmission circuit 100 includes a plurality of integrated circuits, for example, the two integrated circuits 113 and 509. The two-pole coaxial connector 500 has connector signal terminals as many as the integrated circuit, that is, the two connector signal terminals 501 and 502. Thus, even when a signal is transmitted and received using the plurality of integrated circuits, the common mode noise can be reduced in a communication scheme other than differential transmission similarly to the first embodiment.

Seventh Embodiment

Hereinafter, a seventh embodiment of the present invention will be described with reference to FIG. 7.

Figure 7:
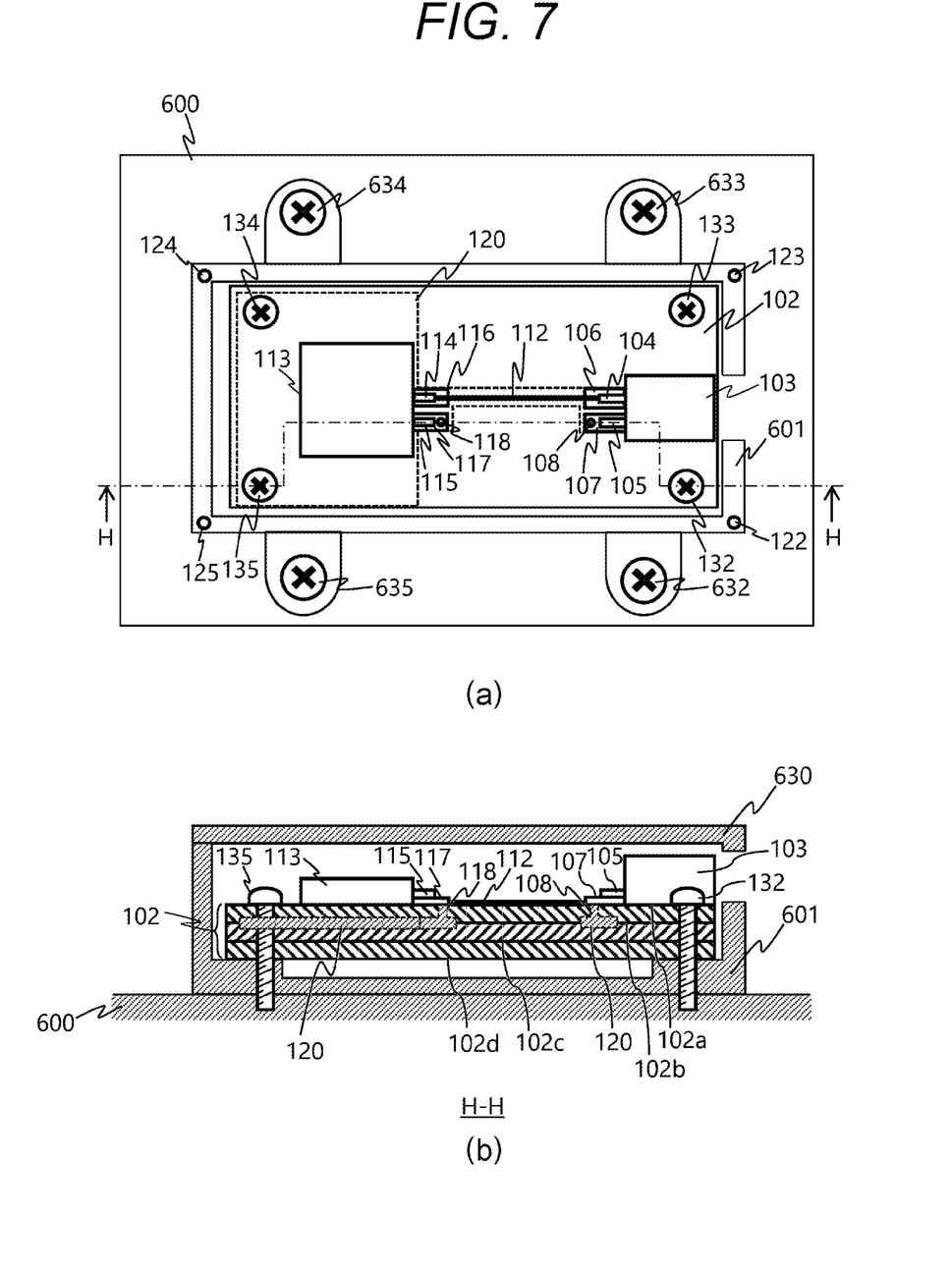
FIG. 7 is a view illustrating a signal transmission circuit according to a seventh embodiment of the present invention.

FIG. 7 is a view illustrating the signal transmission circuit 100 according to the seventh embodiment of the present invention. In FIG. 7, (a) illustrates a top view of the signal transmission circuit 100 of the present embodiment, and (b) illustrates a cross-sectional view taken along line H-H of the signal transmission circuit 100 of the present embodiment.

In the present embodiment, a description will be given regarding an example of a structure of the signal transmission circuit 100 in a case where a resin housing is used as a housing on which the circuit board 102 is mounted.

As illustrated in FIG. 7, the circuit board 102 is built in a housing constituted by a resin cover 630 and a resin base 601 in the signal transmission circuit 100 of the present embodiment. Each of the resin cover 630 and the resin base 601 is formed using resin which is an insulator. The resin base 601 is fixed to a vehicle body 600, which is a metal mounting portion on which the signal transmission circuit 100 is mounted, by screws 632 to 635. Note that FIG. illustrates an example in which the housing that accommodates the circuit board 102 is constituted by the resin cover 630 and the resin base 601, but the housing may be formed using an insulator other than resin.

In the signal transmission circuit 100 of the present embodiment, it is difficult to achieve electrical conduction with the vehicle body 600 even if the signal ground wiring 120 is connected to the resin base 601, which is different from the signal transmission circuit 100 described in the first embodiment Therefore, the electrical conduction with the vehicle body 600 is achieved by adopting a structure as illustrated in FIG. 7(b) in the present embodiment. Specifically, the circuit board 102 is fixed to the vehicle body 600 together with the resin base 601 by elongating the metal screws 132 to 135 that fix the circuit board 102 to the resin base 601. With such a structure, the signal ground wiring 120 and the vehicle body 600 can be electrically connected via the metal screws 134 and 135. Note that the screws 632 to 635 are not necessarily used when the signal transmission circuit 100 can be supported only by the metal screws 132 to 135.

According to the seventh embodiment of the present invention described above, the housing that stores the circuit board 102 is formed using resin. The circuit board 102 is fixed to the vehicle body 600, which is the metal mounting portion, together with the resin base 601, which is the housing, by the metal screws 132 to 135 each of which is a fixing member formed using a conductor. The signal ground wiring 120 is electrically connected to the vehicle body 600 via the metal screws 134 and 135. Thus, even when the resin housing is adopted, the common mode noise can be reduced in a communication scheme other than differential transmission similarly to the first embodiment.

Eighth Embodiment

Hereinafter, an eighth embodiment of the present invention will be described with reference to FIG. 8.

Figure 8:
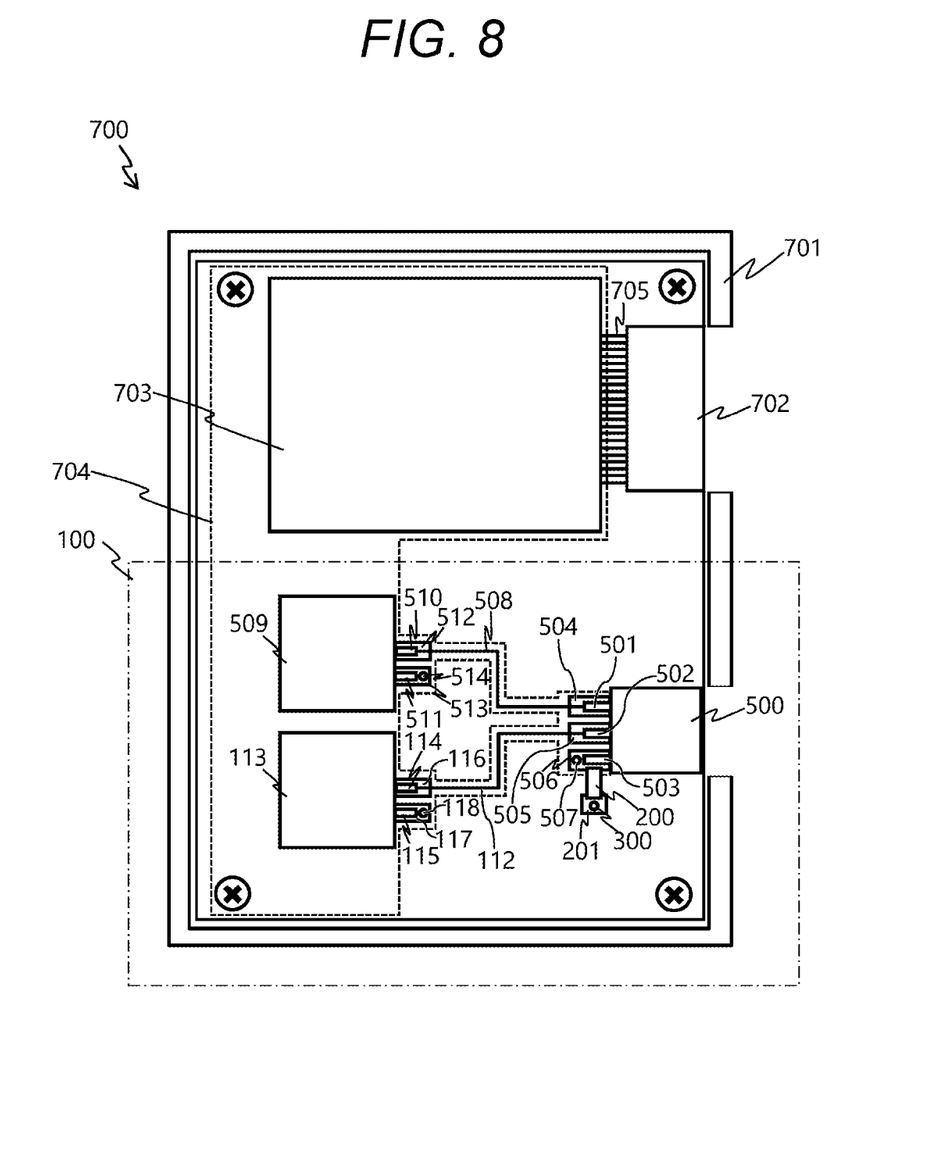
FIG. 8 is a view illustrating an electronic control device according to an eighth embodiment of the present invention.

FIG. 8 is a view illustrating an electronic control device 700 according to the eighth embodiment of the present invention. FIG. 8 illustrates a top view of the electronic control device 700 of the present embodiment. The electronic control device 700 of the present embodiment includes a circuit board 704 stored in a housing 701 made of metal or resin. In addition to the two-pole coaxial connector 500 and the two integrated circuits 113 and 509 described in the sixth embodiment, a multi-pin connector 702 and an electronic circuit 703 are mounted on the circuit board 704. The electronic circuit 703 is connected to an external device via an electronic circuit wiring 705 and the multi-pin connector 702.

In the electronic control device 700 of the present embodiment, a portion of the circuit board 704 on which the two-pole coaxial connector 500 and the integrated circuits 113 and 509 are mounted corresponds to the signal transmission circuit 100 of the sixth embodiment. That is, the high impedance structure as described in the sixth embodiment is formed in this portion, and the common mode noise entering the integrated circuits 113 and 509 from coaxial cables connected to the two-pole coaxial connector 500 can be reduced.

Note that the example in which a part of the circuit board 704 has a structure similar to that of the signal transmission circuit 100 of the sixth embodiment has been described in the present embodiment, but the circuit board may have a structure similar to that described in the other embodiments. That is, it is possible to reduce the common mode noise entering the integrated circuit mounted on the electronic control device by adopting the high impedance structure described in any embodiment.

According to the eighth embodiment of the present invention described above, the electronic control device 700 includes the signal transmission circuit 100 of each of the first to seventh embodiments. Thus, the common mode noise can be reduced in the electronic control device using a communication scheme other than differential transmission.

Note that the respective embodiments described above can be arbitrarily combined and applied. In addition, some of structures of the respective embodiments may be arbitrarily combined.

The above-described respective embodiments and various modifications are merely examples, and the present invention is not limited to these contents unless the features of the invention are impaired. In addition, the various embodiments and modifications have been described as above, but the present invention is not limited to these contents. Other aspects that can be considered within the scope of the technical ideas of the present invention are also included in the scope of the present invention.

The disclosed content of the following priority application is incorporated herein as the citation.

Japanese Patent Application No. 2019-116261 (filed on Jun. 24, 2019)

REFERENCE SIGNS LIST 100 signal transmission circuit
101 metal base
102 circuit board
103 coaxial connector
104, 501, 502 connector signal terminal
105, 503 connector around terminal
112, 508 signal wiring
113, 509 integrated circuit
114, 510 integrated circuit signal terminal
115, 511 integrated circuit ground terminal
120 signal ground wiring
130 metal cover
132, 133, 134, 135 metal screw
200 capacitive element
203 frame ground wiring
302 EMI gasket
400 connector shield
401 dielectric
500 two-pole coaxial connector
600 vehicle body
601 resin base
630 resin cover
700 electronic control device

The invention claimed is:

1. A signal transmission circuit comprising:
a circuit board stored in a housing;
a coaxial connector which is mounted on the circuit board and includes a first signal terminal and a first ground terminal; and
an integrated circuit which is mounted on the circuit board and includes a second signal terminal and a second ground terminal, wherein the second signal terminal is different from the first signal terminal, and wherein the second signal terminal and the first signal terminal are oriented towards each other,
wherein
the first signal terminal and the second signal terminal are connected to each other by a signal wiring arranged on one of a plurality of layers of the circuit board,
the first ground terminal and the second ground terminal are connected to each other by a ground wiring arranged in a predetermined range including a portion immediately above or immediately below the signal wiring in the circuit board,
the first signal terminal and the first ground terminal protrude from one side of the coaxial connector,
the circuit board comprises a plurality of component mounting pads provided along the one side of the coaxial connector on a mounting surface of the coaxial connector,
the first signal terminal and the first ground terminal are each connected to at least one of the plurality of component mounting pads,
the plurality of component mounting pads further comprises at least a first component mounting pad associated with the first signal terminal and a second component mounting pad associated with the second signal terminal connected to each other via the signal wiring, and
at least a part of the ground wiring immediately above or immediately below the signal wiring has a high impedance structure formed to be wider than the signal wiring and narrower than total widths of the plurality of component mounting pads in a direction along the one side of the coaxial connector, wherein each of the first signal terminal and the first ground terminal are connected to at least one of the plurality of component mounting pads.

2. The signal transmission circuit according to claim 1, wherein the coaxial connector electrically connects a coaxial cable and the circuit board.

3. The signal transmission circuit according to claim 2, wherein
the coaxial cable transmits power to be superimposed on a signal input and output between the first signal terminal and the second signal terminal, and
the integrated circuit operates using the power supplied from the coaxial cable via the coaxial connector.

4. The signal transmission circuit according to claim 1, wherein
the housing is formed using a conductor, and
the first ground terminal is electrically connected to the housing via a capacitive element.

5. The signal transmission circuit according to claim 4, further comprising
an EMI gasket arranged between the circuit board and the housing, wherein the first ground terminal is electrically connected to the housing via the capacitive element and the EMI gasket.

6. The signal transmission circuit according to claim 1, further comprising:
a conductive connector shield arranged around the coaxial connector; and
a dielectric arranged between the conductive connector shield and the housing,
wherein
the housing is formed using a conductor, and
the first ground terminal is electrically connected to the housing via the conductive connector shield and the dielectric.

7. The signal transmission circuit according to claim 1, comprising
a plurality of integrated circuits,
wherein the coaxial connector has a plurality of signal terminals as many as the plurality of integrated circuits.

8. The signal transmission circuit according to claim 1, wherein
the housing is formed using resin,
the circuit board is fixed to a metal mounting portion together with the housing by a fixing member formed using a conductor, and
the ground wiring is electrically connected to the metal mounting portion via the fixing member.

9. An electronic control device comprising the signal transmission circuit according to claim 1.

* * * * *